US011280696B2

(12) United States Patent
Barker et al.

(10) Patent No.: US 11,280,696 B2
(45) Date of Patent: Mar. 22, 2022

(54) METHOD AND APPARATUS FOR MODEL-BASED LEAK DETECTION OF A PIPE NETWORK

(71) Applicant: Sensus Spectrum LLC, Raleigh, NC (US)

(72) Inventors: Zachary A. Barker, Durham, NC (US); Michael Eshan Shafiee, Raleigh, NC (US); Travis Smith, Raleigh, NC (US); Amin Rasekh, Atlanta, GA (US); Bruce Campbell, Providence, RI (US); Grant Muller, Marietta, GA (US)

(73) Assignee: Sensus Spectrum LLC, Raleigh, NC (US)

( * ) Notice: Subject to any disclaimer, the term of this patent is extended or adjusted under 35 U.S.C. 154(b) by 272 days.

(21) Appl. No.: 15/402,743

(22) Filed: Jan. 10, 2017

(65) Prior Publication Data

US 2018/0195926 A1 Jul. 12, 2018

(51) Int. Cl.
*G01M 3/28* (2006.01)
*E03B 7/07* (2006.01)
*G06F 30/20* (2020.01)

(52) U.S. Cl.
CPC ............ *G01M 3/2815* (2013.01); *E03B 7/07* (2013.01); *E03B 7/071* (2013.01); *E03B 7/072* (2013.01);
(Continued)

(58) Field of Classification Search
CPC ............................... G01M 3/2815; E03B 7/00
(Continued)

(56) References Cited

U.S. PATENT DOCUMENTS

| 4,308,746 A | 1/1982 | Covington | |
| 4,984,448 A * | 1/1991 | Jordan | G01M 3/02 73/40.5 R |

(Continued)

FOREIGN PATENT DOCUMENTS

| CN | 105674058 | 6/2016 |
| JP | 2013178207 A | 9/2013 |

(Continued)

OTHER PUBLICATIONS

International Search Report and Written Opinion for International Patent Application No. PCT/US2017/052135 dated Dec. 5, 2017.

(Continued)

*Primary Examiner* — Eman A Alkafawi
(74) *Attorney, Agent, or Firm* — Andrus Intellectual Property Law, LLP

(57) ABSTRACT

A method, apparatus, and system for leak detection in a distribution network having consumption meters. The distribution network is divided into zones having an upstream location and a downstream location. An upstream pressure sensor detects the upstream pressure at the upstream location and the downstream pressure sensor detects the detected downstream pressure at the downstream location. A downstream pressure lookup table is used to determine an expected pressure at each downstream location based on a range of hypothetical upstream pressures at the corresponding upstream location and consumption data from the consumption meters. The expected pressure and the detected downstream pressure at each downstream location are compared to determine if the calculated discrepancy exceeds a discrepancy threshold. If a discrepancy exceeds a discrepancy threshold, a leak location lookup table containing a set of potential leak locations based on a range of hypothetical discrepancies is used to determine a set of probable leak locations.

20 Claims, 12 Drawing Sheets

(52) U.S. Cl.
CPC .............. *E03B 7/075* (2013.01); *E03B 7/078* (2013.01); *G06F 30/20* (2020.01)

(58) Field of Classification Search
USPC .......................................................... 702/51
See application file for complete search history.

(56) References Cited

U.S. PATENT DOCUMENTS

| | | | |
|---|---|---|---|
| 5,625,150 | A | 4/1997 | Greene et al. |
| 7,920,983 | B1 | 4/2011 | Peleg et al. |
| 8,341,106 | B1 | 12/2012 | Scolnicov et al. |
| 8,479,566 | B2 | 7/2013 | Haseloh et al. |
| 8,820,143 | B2 | 9/2014 | Sarma et al. |
| 9,335,233 | B2 | 5/2016 | Khalifa et al. |
| 9,366,596 | B2 | 6/2016 | Mekid et al. |
| 2001/0049958 | A1* | 12/2001 | Yamaguchi ........ F02M 25/0809 73/40.5 R |
| 2005/0246112 | A1* | 11/2005 | Abhulimen ............... F17D 5/02 702/51 |
| 2011/0290331 | A1 | 12/2011 | Burrows |
| 2013/0211797 | A1 | 8/2013 | Scolnicov et al. |
| 2014/0121999 | A1* | 5/2014 | Bracken ................ G01M 3/243 702/51 |
| 2014/0124057 | A1* | 5/2014 | Freund ...................... G01F 1/34 137/455 |
| 2014/0149054 | A1 | 5/2014 | Hanss |
| 2014/0255216 | A1 | 9/2014 | Kallesoe |
| 2015/0308919 | A1* | 10/2015 | Zhang ................... G01M 3/243 702/51 |
| 2016/0320261 | A1* | 11/2016 | Zhu ..................... G01M 3/2807 |

FOREIGN PATENT DOCUMENTS

| | | |
|---|---|---|
| WO | 03/046503 A1 | 6/2003 |
| WO | 2015/087378 A1 | 6/2015 |

OTHER PUBLICATIONS

International Search Report and Written Opinion for PCT/US2017/052134 dated Nov. 2, 2017.
Unpublished U.S. Appl. No. 15/226,597, filed Aug. 2, 2016.
Examination Report for International Patent Application No. 17780262.6 dated Aug. 24, 2021.
Examination Repon for International Patent Application No. 17781587.5 dated Jan. 19, 2022.

* cited by examiner

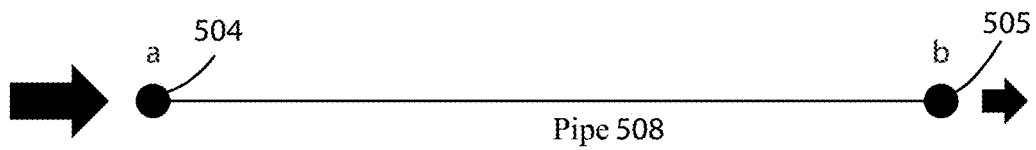

Bernoulli's equation governs the flow and pressure within water distribution networks $$\frac{v_a^2}{2g} + z_a + \frac{p_a}{\gamma} = \frac{v_b^2}{2g} + z_b + \frac{p_b}{\gamma} + h_l \quad (1)$$

$$h_l = \frac{fl}{D}\frac{v^2}{2g} \quad (2)$$

$v$ = water velocity
$z$ = elevation
$p$ = pressure
$g$ = gravitational constant
$\gamma$ = unit weight of water
$h_l$ = friction losses
$f$ = friction factor
$l$ = length
$D$ = diameter

Figure 5 p = pressure
z = elevation
Q = flow
q = demand
D = Diameter
f = friction factor
l = length
a = location of upstream sensor
b = location of downstream sensor
n = number of pipe segments

METHOD AND APPARATUS FOR MODEL-BASED LEAK DETECTION OF A PIPE NETWORK

BACKGROUND

The Background and Summary are provided to introduce a foundation and a selection of concepts that are further described below in the Detailed Description. The Background and Summary are not intended to identify key or essential features of the potentially claimed subject matter, nor are they intended to be used as an aid in limiting the scope of the potentially claimed subject matter.

The present disclosure relates to leak detection for a pipe network or a subset of a pipe network. More specifically, the present disclosure relates to a method and apparatus for model-based leak detection using consumption meters along with sensors within the pipe network.

Presently, water distribution systems deliver water to households, commercial buildings, and industrial facilities through a network that includes tanks, pipes, and pumps. FIG. 1 depicts a representative water distribution system 10. The water distribution system 10 includes a water main 12 and valves 14 to control water flow in sub mains 16. Each sub main 16 may include one or more branches 18, which may also include a loop, that have waters meters 20 that meter water consumption and provide corresponding consumption data. Flush points 22 depicted in the water distribution system 10 may be used for testing and maintenance, such as for controlling water aging, treatment, etc.

Water utilities rely on hydraulic models to simulate the movement of water in a water distribution system. A hydraulic model represents the layout of nodes, pumps, tanks, pipes, valves, and water resources in the water distribution system. The hydraulic model simulates pressures and water flows in pipes using the geographical location of the pumps, tanks, pipes, reservoirs, and water sources, along with parametric data. Example parametric data includes pipe roughness, pump performance curves, etc.

The typical water distribution system has many distributed consumption points, such as the metered consumption points associated with the various industrial, commercial, and residential customers of the operator of the water distribution system. Hydraulic models include so-called "service nodes" to model the consumption points in the water distribution system. A service node is a physical location within the water distribution network that represents a demand in a hydraulic model, which can be a single demand or an aggregation of multiple demands. As an example, all or a subset of the metered consumption points along a branch 18 may be represented by a corresponding service node in the hydraulic model. The service node would have a modeled physical location at a pipe location in or leading into the involved branch 18. This is distinguishable from the prior art, where a hydraulic file is created not based on water demand and service nodes, but on topology.

The water demand or amount of water consumed at each service connection may be estimated using available historical data. However, such data sets typically lack the resolution and accuracy to make accurate consumption estimates for particular times or days. Moreover, the mechanisms for associating actual consumption in the water distribution system with the modeled service nodes are simplistic and prone to inaccuracies, e.g., based on simple proximity. Specifically, typical hydraulic models known in the art use historic data to create demands and demand patterns for each customer (or group of customers). The major errors occur because often there is no historical data. Even when there is historical data on which to base the demand patterns, the data are merely averages and do not represent the dynamics of the system. To the extent that actual consumption in the water distribution system is attributed to the wrong service node in the hydraulic model, the hydraulic model will necessarily produce inaccurate results for control, forecasting, or other uses, and model adaptations tainted by such inaccuracies may worsen, rather than improve the model accuracy.

The disclosure of U.S. patent application Ser. No. 15/226,597, which has been incorporated by reference in its entirety, provides an improved hydraulic model using real-time or near-real-time data from an Automated or Advanced Metering Infrastructure (AMI), which includes consumer consumption meters, to improve model accuracy, particularly by obtaining more accurate, higher-resolution water demand values for service nodes in the model. Improving the accuracy of water demand calculation for the service nodes in the model stems from an improved technique that more accurately determines which consumption points in the water distribution system should be associated with each service node and from the use of real-time or near-real-time consumption data. The computer apparatus uses the water demand values to improve the accuracy and resolution of its water flow and pressure estimates. In turn, the improved flow and pressure estimation provides for more accurate control, e.g., pumping or valve control, flushing control or scheduling, leak detection, step testing, etc.

According to some embodiments, a method performed by a computer apparatus includes obtaining a meter elevation, a meter location, and water consumption data, for individual water meters installed in a water distribution system. The method also includes automatically associating each water meter with a respective one of a plurality of service nodes representing points of water consumption in a hydraulic model of the water distribution system. This is achieved by evaluating modeled location and elevation data for the service nodes in relation to the meter location and the meter elevation, to identify the geographically-closest service node having a modeled head that is greater than the meter elevation.

Further, the method includes calculating water demand values for each service node, based on an aggregation of the water consumption data for all of the water meters that have been automatically associated with the service node. The method also includes estimating water flows and pressures for at least a portion of the water distribution system, by running the hydraulic model with the calculated water demand values. The method then includes performing a control operation for the water distribution system, based on the estimated water flows and pressures. The control operation comprising at least one of leak detection, tank level, PRV (Pressure Reducing Valve) setting change, pumping or storage control, and treatment or flushing control.

In another example embodiment, a computer apparatus comprises input/output circuitry and processing circuitry operatively associated with the input/output circuitry. The input/output circuitry includes at least one of a network communication interface circuit configured for communication on a computer network, and a storage system interface circuit configured for reading data from and writing data to a storage system. Among other things, the processing circuitry is configured to associate water meters in the water distribution network with service nodes in a hydraulic model of the water distribution system.

In an example configuration, the processing circuitry is configured to obtain a meter elevation, a meter location, and water consumption data, for individual water meters installed in a water distribution system, and automatically associate each water meter with a respective one of a plurality of service nodes representing points of water consumption in a hydraulic model of the water distribution system. The processing circuitry carries out the association processing by evaluating modeled location and elevation data for the service nodes in relation to the meter location and the meter elevation, to identify the geographically-closest service node having a modeled head that is greater than the meter elevation.

The processing circuitry is further configured to calculate water demand values for each service node, based on an aggregation of the water consumption data for all of the water meters that have been automatically associated with the service node, and to estimate water flows and pressures for at least a portion of the water distribution system, by running the hydraulic model with the calculated water demand values. Still further, the processing circuitry is configured to perform a control operation for the water distribution system, based on the estimated water flows and pressures, said control operation comprising at least one of leak detection, pumping or storage control, and treatment or flushing control.

In addition to the issues discussed above, it has been recognized that non-revenue water remains a major concern for utilities. Treating and pumping water that does not supply legitimate customers such as through leaks, theft, or faulty metering increases costs, reduces water availability, and contributes greenhouse gases. Some have estimated that nationally 10-20% of produced water generates no revenue for the utility.

It is in the utilities best interest to locate these non-revenue waters; therefore, a variety of strategies have been traditionally employed. One strategy is a water audit. Water audits start with the volume of water sourced and account for the water along each stage of the system, finishing with the demands. This accounting identifies the amount of non-revenue water that is produced within the system, but does not help to actually locate leaks, theft, or faulty consumption meters.

Step tests have been valuable in detecting leaks. These tests are performed by isolating an area of the network and shutting off valves in sequence. A flow meter upstream records the drops in flow at each shut off. Disproportionate drops in flow indicate a leak downstream of the most recently shut valve. Drawbacks of these step tests include the manpower required and the required interruptions to service. Further, the step test does not help identify the location of the leak beyond placing it between two valves.

Finally, acoustic sensing may be used to locate leaks. With this method, acoustic sensors are used to identify noise associated with leaks. This typically requires a skilled operator to walk the network with an acoustic device, listening for leaks. Further complications arise when the pipe material is plastic or other factors dampen the soundwaves.

Through experimentation and analysis, the present inventors have developed a Leak Detection System that significantly improves the accuracy of leak detection while reducing the effort required by the utility relative to the current state of the art.

SUMMARY

The present disclosure relates to a method, apparatus, and system for leak detection in a distribution network having consumption meters. The distribution network is divided into zones having an upstream location and a downstream location. An upstream pressure sensor detects the upstream pressure at the upstream location and the downstream pressure sensor detects the detected downstream pressure at the downstream location. A downstream pressure lookup table is used to determine an expected pressure at each downstream location based on a range of hypothetical upstream pressures at the corresponding upstream location and consumption data from the consumption meters. The expected pressure and the detected downstream pressure at each downstream location are compared to determine if the calculated discrepancy exceeds a discrepancy threshold. If the calculated discrepancy exceeds the discrepancy threshold, a leak location lookup table containing a set of potential leak locations based on a range of hypothetical discrepancies at each downstream location is used to determine a set of probable leak locations corresponding to the calculated discrepancy.

Various other features, objects and advantages of the invention will be made apparent from the following description taken together with the drawings.

BRIEF DESCRIPTION OF THE DRAWINGS

The drawings illustrate the best mode presently contemplated of carrying out the disclosure. The same numbers are used throughout the Figures to reference like features and like components. In the drawings:

FIG. 5 is a simplified diagram of a pipe within a distribution network and Bernoulli's equation governing the flow and pressure;

FIG. 7b is an exploded view of zones 1-3 taken from FIG. 7a;

DETAILED DESCRIPTION

Through experimentation and analysis, the present inventors have developed a Leak Detection System that significantly improves the accuracy of leak detection while reducing the effort required by the utility relative to the current state of the art.

In one embodiment, the Leak Detection System comprises pressure sensors, advanced metering infrastructure at points of consumption, and a proprietary algorithm. The present inventors have found that pressure sensors are particularly suited for this purpose because they are relatively inexpensive and easier to install than other sensors and meters. Pressure sensors can also be installed without requiring a shutdown. In many cases they can be installed at available ports without excavation. Likewise, having an advanced metering infrastructure is also convenient since it also provides the utility with various other services. However, it should be recognized that other types of sensors may also be used in the presently disclosed Leak Detection System, which is also referred to as an edge analysis leak device Communication between the pressure sensors and consumption meters enable the Leak Detection System to continuously check readings against calculated expected values. Integrated algorithms may be used to identify a leak, determine the location of the leak, and determine the size of the leak. This information may be communicated to the utility, trigger further testing, or trigger adjustments within the distribution network.

Figure 3:
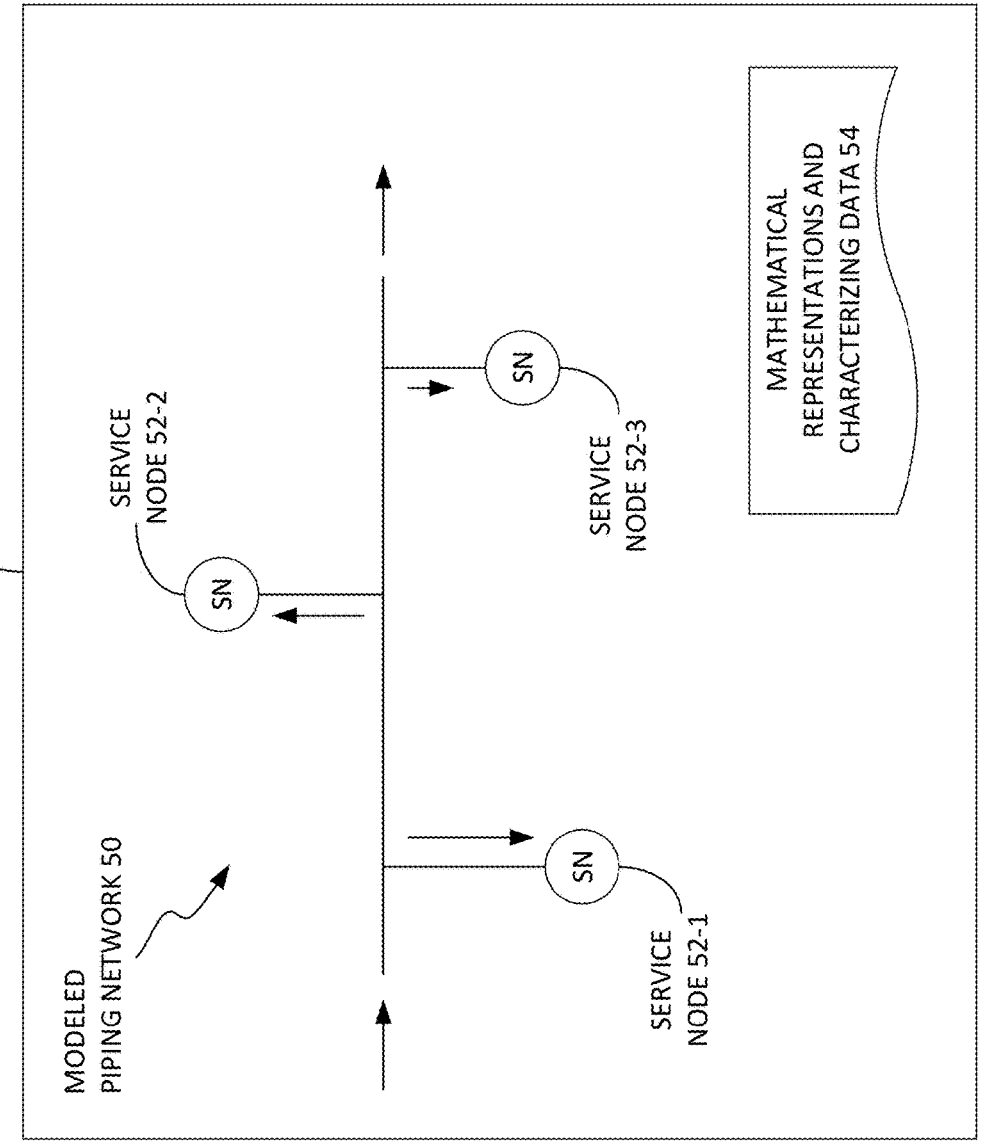
FIG. 3 is a diagram of an exemplary data structure or collection operative as a hydraulic model of a distribution network, such as may be used by the computer apparatus of FIG. 2.
Figure 4:
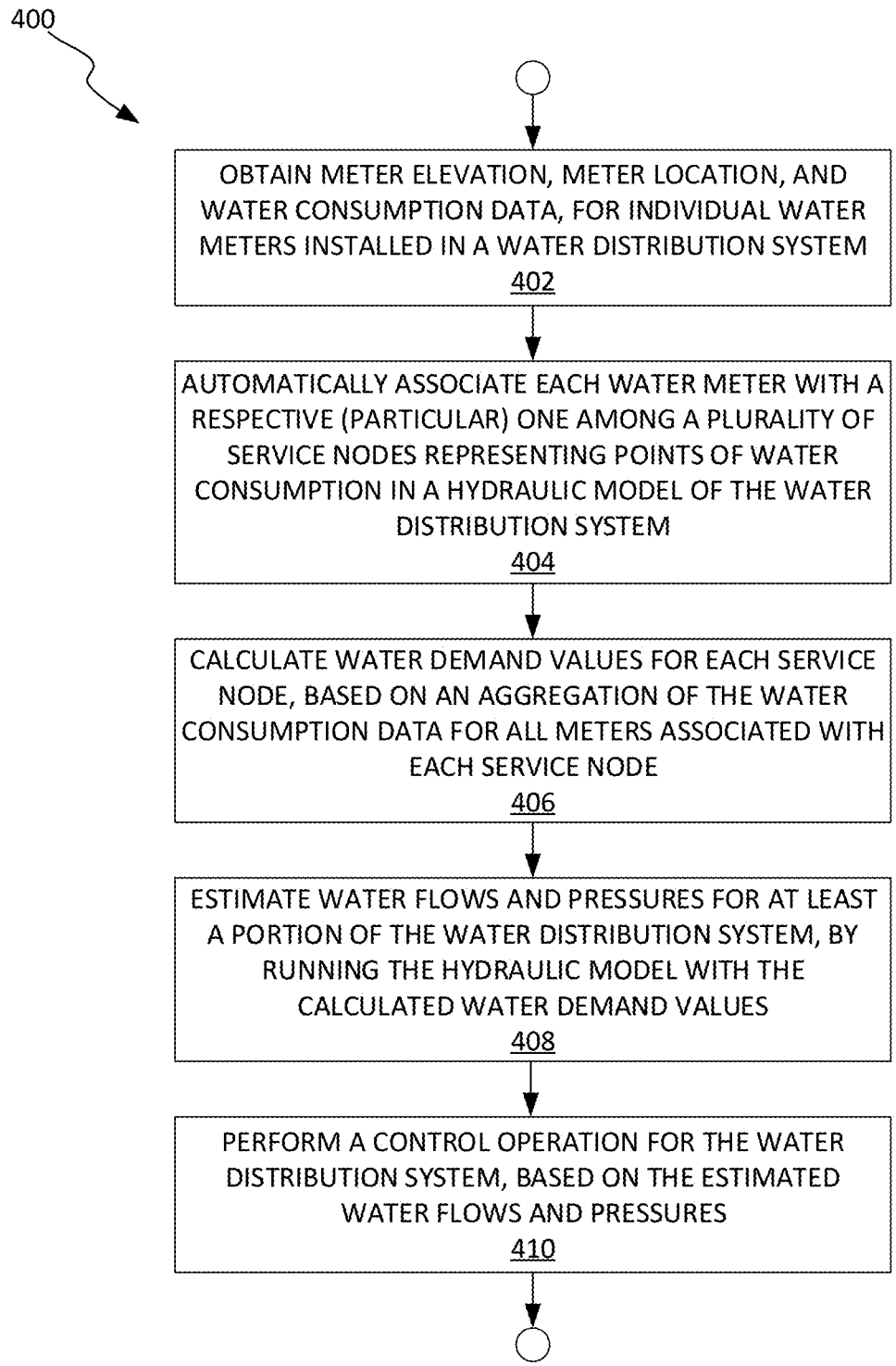
FIG. 4 is a logic flow diagram of an exemplary method of performing one or more control actions towards a water distribution system, such as may be implemented by the computer apparatus of FIG. 3, or by other processing arrangements.

The Leak Detection System analyzes data from an upstream pressure sensor at upstream location along with data from AMI and/or Real-Time Hydraulic Modeling as disclosed in U.S. patent application Ser. No. 15/226,597 to solve for the pressure at the downstream sensor. The AMI can be used to obtain consumption meter data and the Real-Time Hydraulic Model can be used with processed consumption data to determine flow and pressure at pipes and nodes that are not equipped with a pressure sensor. The Real-Time Hydraulic Model and related calculations are generally shown in FIGS. 2-4.

Figure 1:
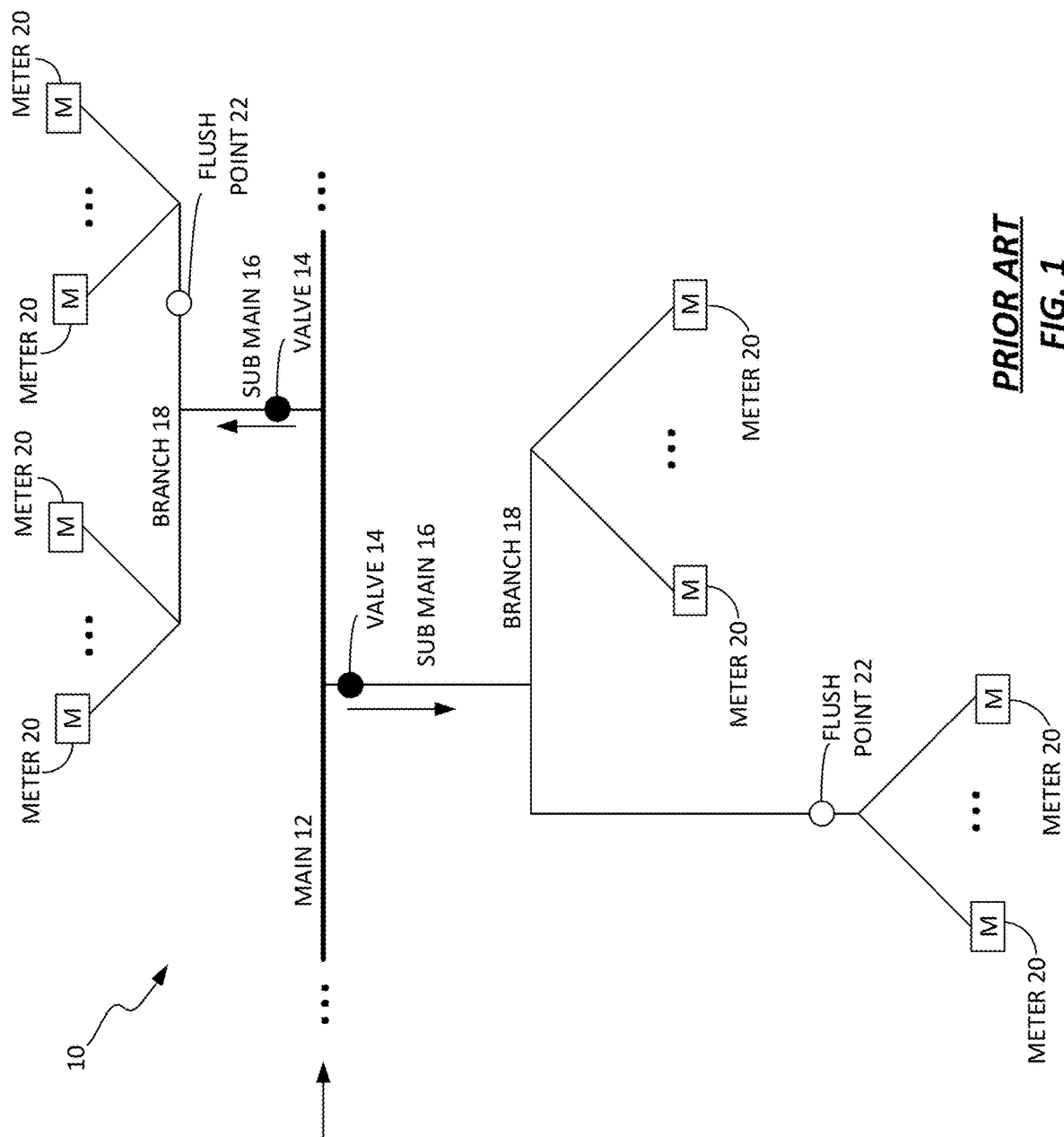
FIG. 1 is a simplified diagram of an example distribution network.
Figure 2:
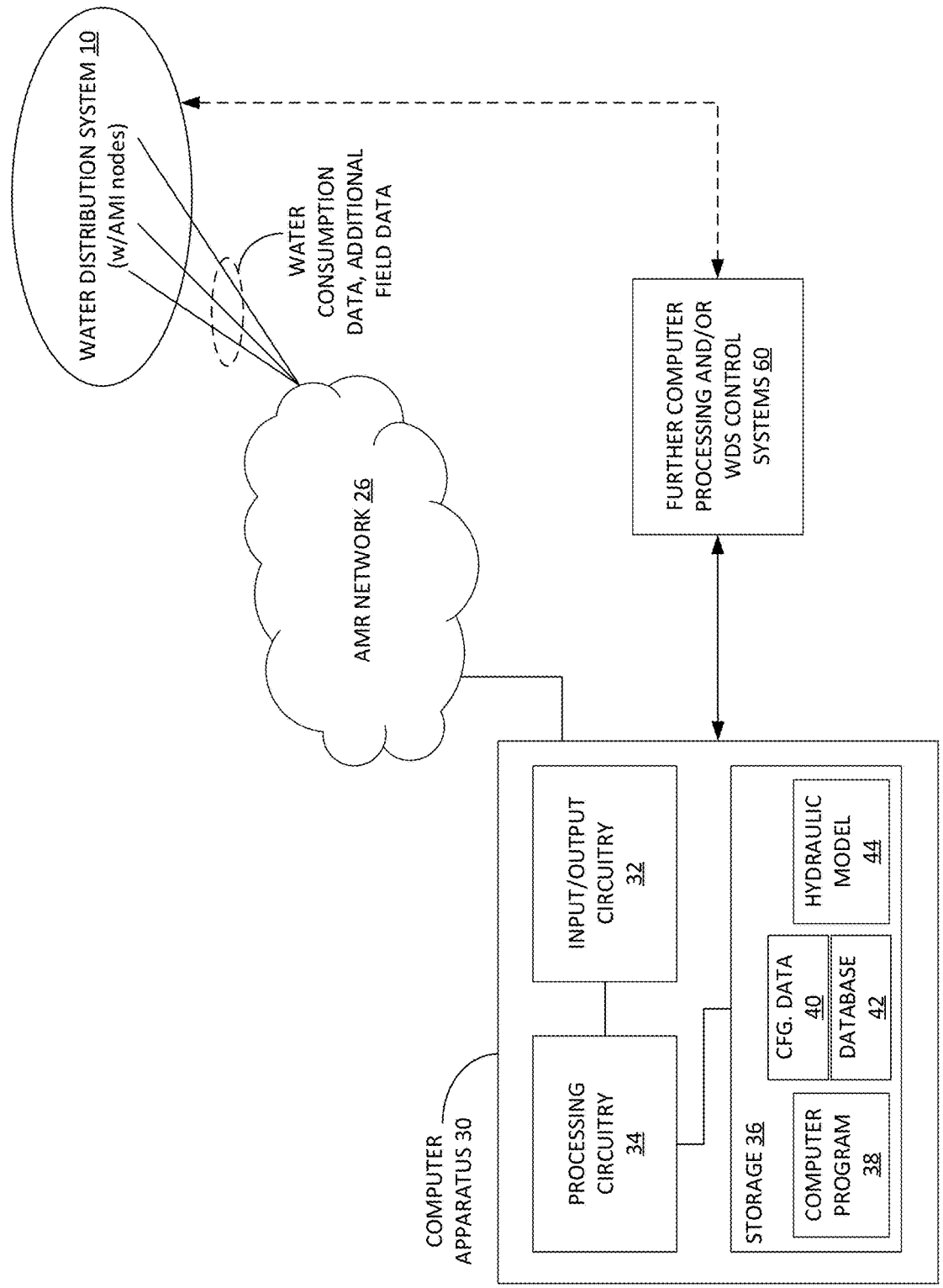
FIG. 2 is a block diagram of one exemplary computer apparatus configured to perform one or more control actions with respect to a distribution network.

FIG. 2 is a diagram illustrating one embodiment of a computer apparatus 30 and an Automatic Meter Reading (AMR) network 26 that obtains water consumption data from the meters 20 (see FIG. 1) of a water distribution system 10, along with additional field data, such as measured water pressures and flow rates. The AMR network 26 may be part of an Advanced Metering Infrastructure (AMI). For example, the AMR network 26 includes radio frequency communication modules incorporated in or coupled to meters, pressure sensors, flow sensors, etc., for wireless reporting to base stations or other network nodes. A person having ordinary skill in the art will recognize that communication of information throughout the present disclosure may be wired or wireless, including but not limited to cellular, RF, narrow band, Ethernet, and other mechanisms known in the art.

The computer apparatus 30 includes input/output circuitry 32 to obtain the water consumption data and additional field data from the AMR network 26. Additionally, the computer apparatus 30 may provide further computer processing and/or may serve as or support a water distribution system control system 60 for the water distribution system 10. The input/output circuitry 32 may include communication interface circuits, such as an Ethernet or another computer network interface suitable for communicating with a node in the AMR network 26. Of course, the input/output circuitry 32 may, as an addition or as an alternative, include a cellular radio modem or other radio frequency communication interface that is configured to communicatively couple the computer apparatus 30 to the AMR network 26. In general, the input/output circuitry 32 includes one or more physical-layer interface circuits for bi-directional communication between the computer apparatus 30 and one or more external device(s), nodes or systems, such as those that are part of the AMR network 26.

The computer apparatus 30 also includes processing circuitry 34 that is operatively associated with the input/output circuitry 32. The processing circuitry 34 may include one or more microprocessor-based circuits, Digital Signal Processors (DSPs), Field Programmable Gate Arrays (FPGAs), Complex Programmable Logic Devices (CPLDs), Application Specific Integrated Circuits (ASICs), or any mix thereof. More broadly, the processing circuitry 34 comprises fixed circuitry, programmed circuitry, or a mix of fixed and programmed circuitry. Here, "fixed" circuitry denotes circuitry that is preconfigured to carry out particular operations or functions, while programmed circuitry takes on such configuration as a consequence of program instruction execution.

The computer apparatus 30 also includes storage 36, which in one or more embodiments provides volatile and non-volatile storage, e.g., working or data memory, along with program and data storage. While the storage 36 may comprise more than one type of storage—e.g., more than one type of memory or storage circuit—it shall be broadly understood as comprising a computer-readable medium, that includes storage for a hydraulic model 44 and any other relevant information that may be stored in a database 42.

In one or more embodiments, the storage 36 stores a computer program 38 comprising program instructions that, when executed by one or more processing circuits of the computer apparatus, specially adapts such processing circuits to operate as the aforementioned processing circuitry 34. For such operation, the storage 36 provides non-transitory storage for the computer program 38 and any related configuration data 40, where "non-transitory" does not necessarily mean permanent or unchanging but does connote storage of at least some persistence, e.g., the program instructions are held in memory for execution. As such, the storage 36 comprises, for example, SRAM, DRAM, or other working memory, along with FLASH, EEPROM, SSD, or another non-volatile storage circuitry.

The computer apparatus 30 further includes processing circuitry 34 that is operatively associated with the input/output circuitry 32 and configured to obtain a meter elevation, a meter location, and water consumption data, for each individual water meter 20 installed in a water distribution system 10. The processing circuitry 34 may also obtain, e.g., via the input/output circuitry 32, geographic information data or metadata that represents the physical connections and pipe layout of the water distribution system 10. The processing circuitry 34 is further configured to automatically associate each water meter 20 with a respective one of a plurality of service nodes 52 representing points of water consumption in a hydraulic model 44 of the water distribution system 10, as shown in FIG. 3.

FIG. 3 is a diagram illustrating an example hydraulic model 44. As illustrated in FIG. 3, the hydraulic model 44 may include a modeled piping network 50 with multiple service nodes, e.g., service nodes 52, e.g., 52-1, 52-2, 52-3, and so on. The hydraulic model 44 further includes mathematical representations and characterizing data 58. Such characterizing data includes, e.g., pipe roughness coefficients for some or all of the piping represented in the hydraulic model, along with pump performance curves for pumps or pumps stations represented in the hydraulic model 44.

The automatic association of each water meter 20 to one of the service nodes 52 is based on the processing circuitry 34 evaluating modeled location and elevation data for the service nodes 52 in relation to the meter location and the meter elevation, to identify the geographically-closest service node 52 having a modeled head that is greater than the meter elevation. The association of meters to service nodes can be performed using the Geographic Information Systems (GIS). Note that the modeled elevation may be an elevation known for a point or junction in the piping within the water distribution system 10 that corresponds to the service node 52.

FIG. 4 illustrates a method 400 performed by a computer apparatus, such as the computer apparatus 30. However, other computer arrangements may be used for carrying out the method 400. Further, one or more steps or operations in the illustrated method 400 may be performed in an order other than the example order suggested by the diagram. Still further, one or more steps may be performed concurrently and/or in conjunction with other processing, and it will be appreciated that all or part of the illustrated processing may be performed on a repeating or looped basis, e.g., responsive to periodically updated field data incoming from the AMR network 26, on a time, periodic basis, such as every ten minutes, every hour, etc.

The method 400 includes obtaining (Block 402) a meter elevation, a meter location, and water consumption data, for each individual water meter 20 installed in a water distribution system 10, and automatically associating (Block 404) each water meter 20 with a respective one of a plurality of service nodes 52 representing points of water consumption in a hydraulic model 44 of the water distribution system 10. The association is performed by evaluating modeled location and elevation data for the service nodes 52 in relation to the meter location and the meter elevation, to identify the geographically-closest service node 52 having a modeled head that is greater than the meter elevation.

The method 400 further includes calculating (Block 406) water demand values for each service node 52, based on an aggregation of the water consumption data for all of the water meters 20 that have been automatically associated with the service node 52. Still further, the method 400 includes estimating (Block 408) water flows and pressures for at least a portion of the water distribution system 10, by running the hydraulic model with the calculated water demand values, and performing (Block 410) a control operation for the water distribution system 10. The control operation is performed based on the estimated water flows and pressures, and comprises at least one of leak detection, pumping or storage control, and treatment or flushing control.

Figure 7B:
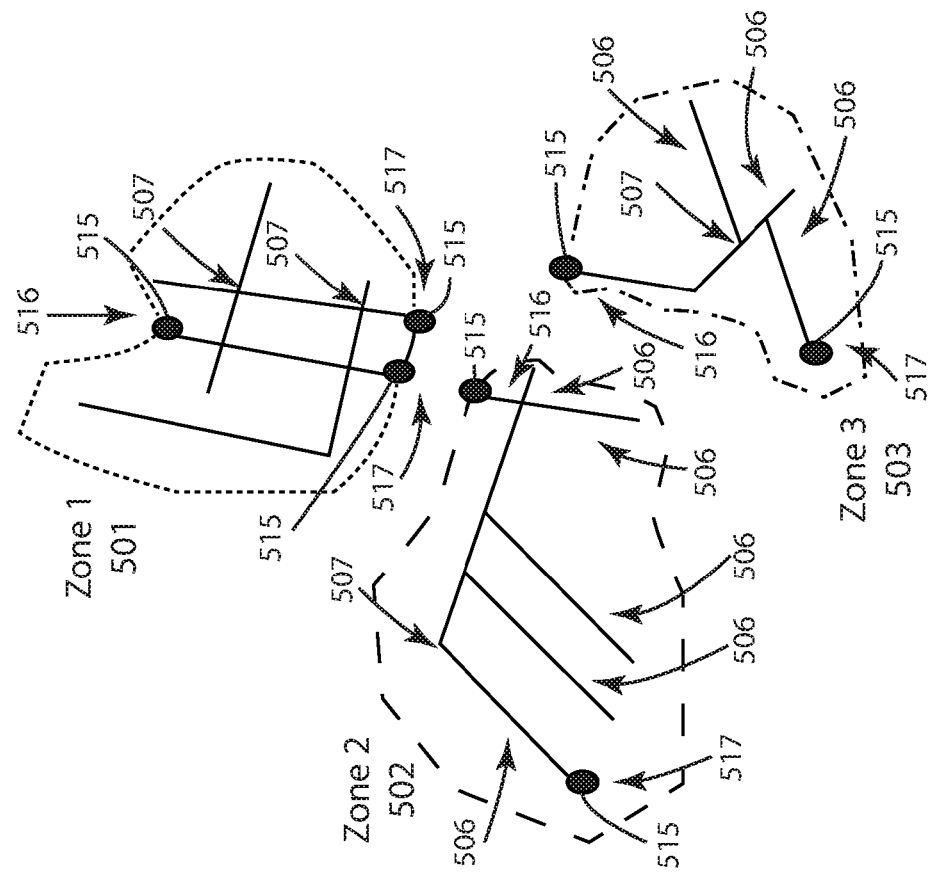
Figure 7A:
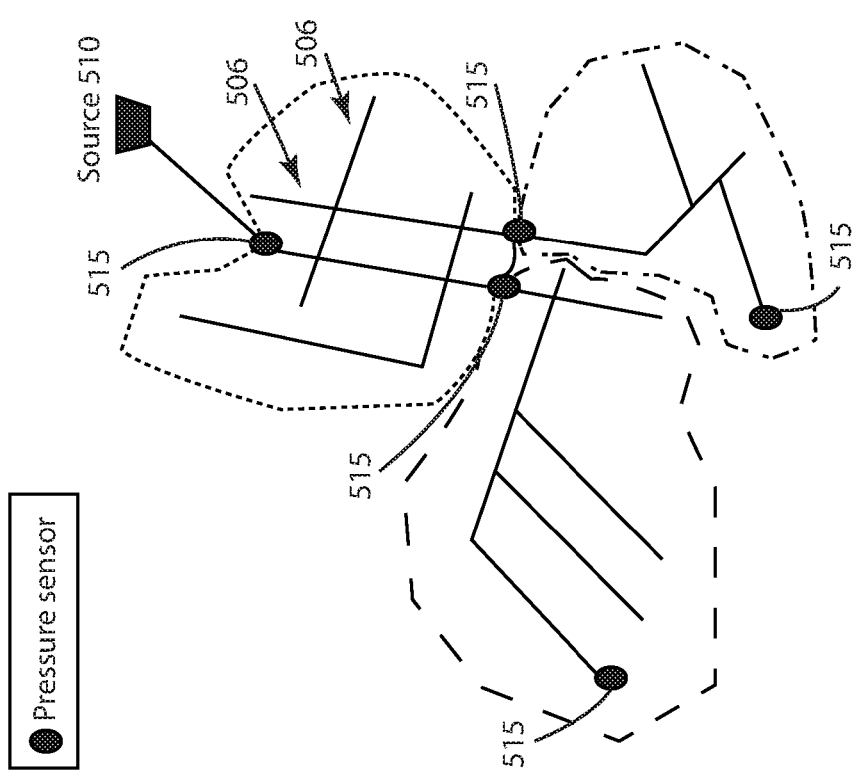
FIG. 7a is a simplified diagram of a portion of a distribution network that can be divided into zones.

The present inventors have recognized that the specific placement of the pressure sensors within the distribution network may impact the accuracy of leak detection. In one embodiment, the distribution network 500 is divided into zones 1, 2, and 3 as shown in FIGS. 7a and 7b. As shown, multiple branches 506 of pipes 508 (FIG. 5) are connected together between the starting point 516 and the ending point 517 of the zones 1, 2, 3, whereby the branches 506 are interconnected at nodes 507. Pressure sensors 515 are placed at least near the starting point 516 and ending point 517 of each zone to create "virtual" boundaries for that zone. In some cases, the starting point and ending point are also referred to as the upstream location and the downstream location, respectively. The same pressure sensor 515 serving as an ending point 517 for a first zone may also serve as the starting point for another zone that is downstream of the first zone. It is advantageous for zones to be small enough for the algorithm to locate leaks with high accuracy, yet large enough to avoid the high costs of having excessive pressure sensors. While there are advantages to limiting the size of a zone, the present inventors have found that by increasing the distance between the pressure sensors, the impact of friction between the pressure sensors increases, improving the accuracy of the Leak Detection System. In one embodiment, a one mile distance between pressure sensors was found to provide accurate results, though greater or lesser distances also provide accurate results.

Figure 6:
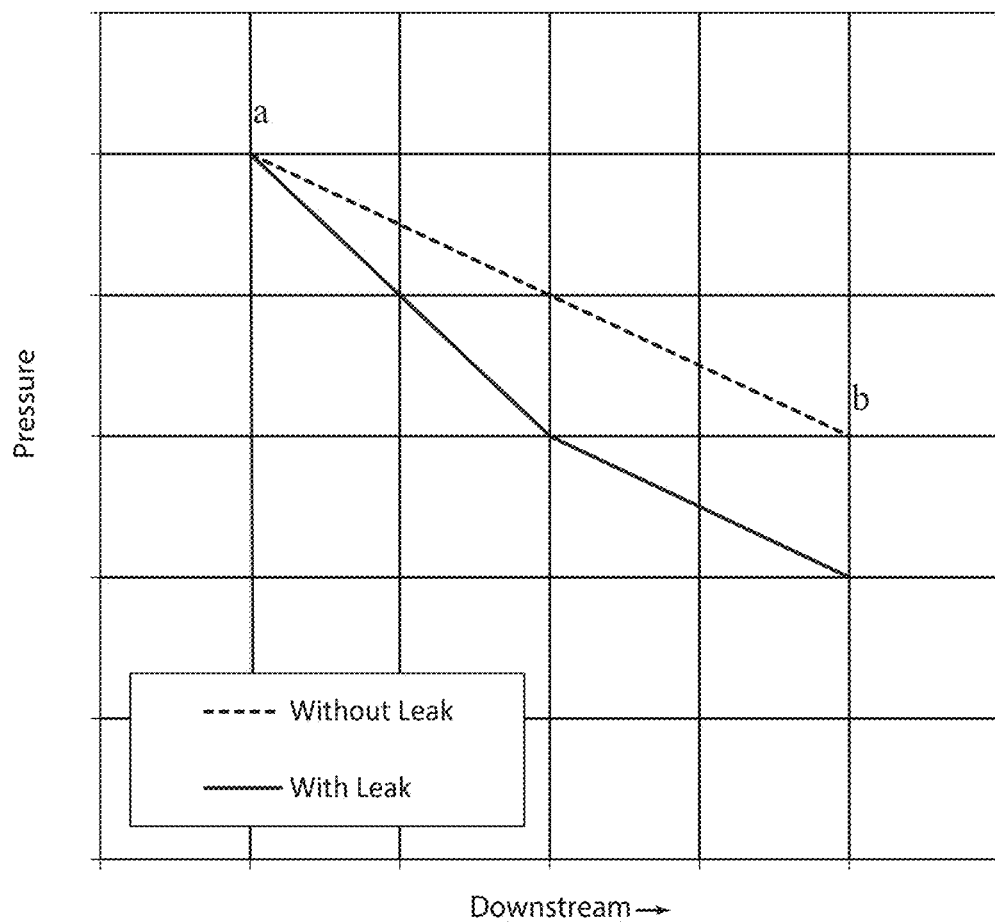
FIG. 6 is a chart exemplifying the difference in pressure loss at a downstream location with and without a leak being present.

FIG. 6 depicts the relationship between pressure and distance as a fluid, such as water, travels through a pipe from an upstream location a to a downstream location b. The dashed line represents this relationship with the no leak in the pipe. It can be seen that the pressure along a pipe decreases with distance due to friction. However, when a leak is present, friction losses increase due to the increased flow. The increase in friction losses translate directly to a reduction of pressure between the upstream location a and the downstream location b, as shown by the solid line.

As shown in FIG. 5, Bernoulli's equation can be used to determine properties of the distribution network based on data provided by pressure sensors and consumption meters. Specifically, the relationship between an upstream location (a) 504 and downstream location (b) 505 for the exemplary system diagrammed in FIG. 5 are governed by the following Equations:

$$\frac{v_a^2}{2g} + z_a + \frac{p_a}{\gamma} = \frac{v_b^2}{2g} + z_b + \frac{p_b}{\gamma} + h_l \quad (1)$$

$$h_l = \frac{fl}{D}\frac{v^2}{2g} \quad (2)$$

where:
$v$ = water velocity
$z$ = elevation
$p$ = pressure
$g$ = gravitational constant
$\gamma$ = unit weight of water
$h_l$ = friction losses
$f$ = friction factor
$l$ = length
$D$ = diameter Therefore, if the other parameters are known, including the pressure at location a, Bernoulli's equation may be used to determine the pressure at a downstream location b. Friction losses, which are accounted for in Equation 2 in FIG. 5, are calculated as a function of flow and physical parameters. Since the physical parameters of elevation, diameter, and length are constant, and roughness is relatively constant, only the pressure at upstream location a and velocity are required for every calculation.

Figure 8A:
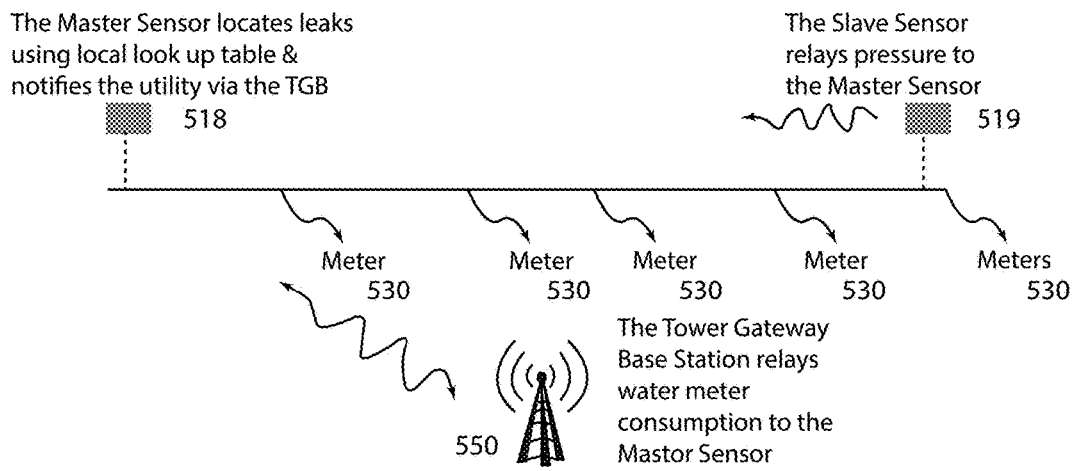
FIG. 8a is a simplified diagram exemplifying one configuration for communicating data in accordance with the present disclosure.
Figure 8B:
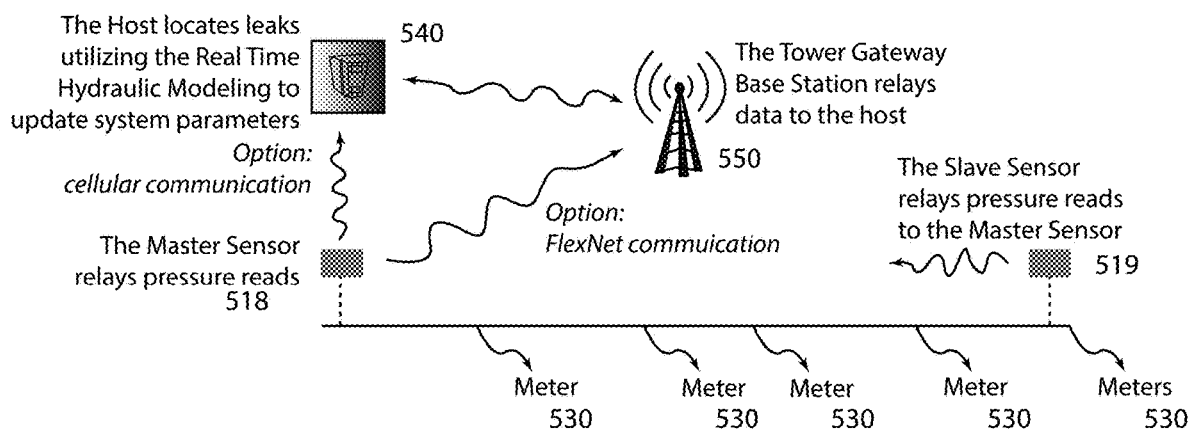
FIG. 8b is a simplified diagram exemplifying another configuration for communicating data in accordance with the present disclosure.

FIGS. 8a and 8b provide exemplary configurations for communication between pressure sensors 515 and consumption meters 530. In the embodiment shown in FIG. 8*a*, one pressure sensor serves as a Master Sensor 518 and at least one other serves as a Slave Sensor 519. The Slave Sensor or Slave Sensors 519 transmit data to the Master Sensor 518, which incorporates the data into the Real-Time Hydraulic Model. In this configuration, the Master Sensor may comprise firmware, which may be initialized specifically for the particular leak detection system and distribution network. In another embodiment, the Leak Detection System, whether through a Master Sensor 518 or directly from each pressure sensor 515, may transmit the data to a separate host 540 comprising the firmware, as shown in FIG. 8*b*. Data transmission or communication may also be configured to utilize an existing data network tower such as a tower gateway base station 550 incorporating Sensus FlexNet or, for more rapid processing, cellular communication. Once transmitted to the host, this data can be integrated into Real-Time Hydraulic Modeling.

Figure 9:
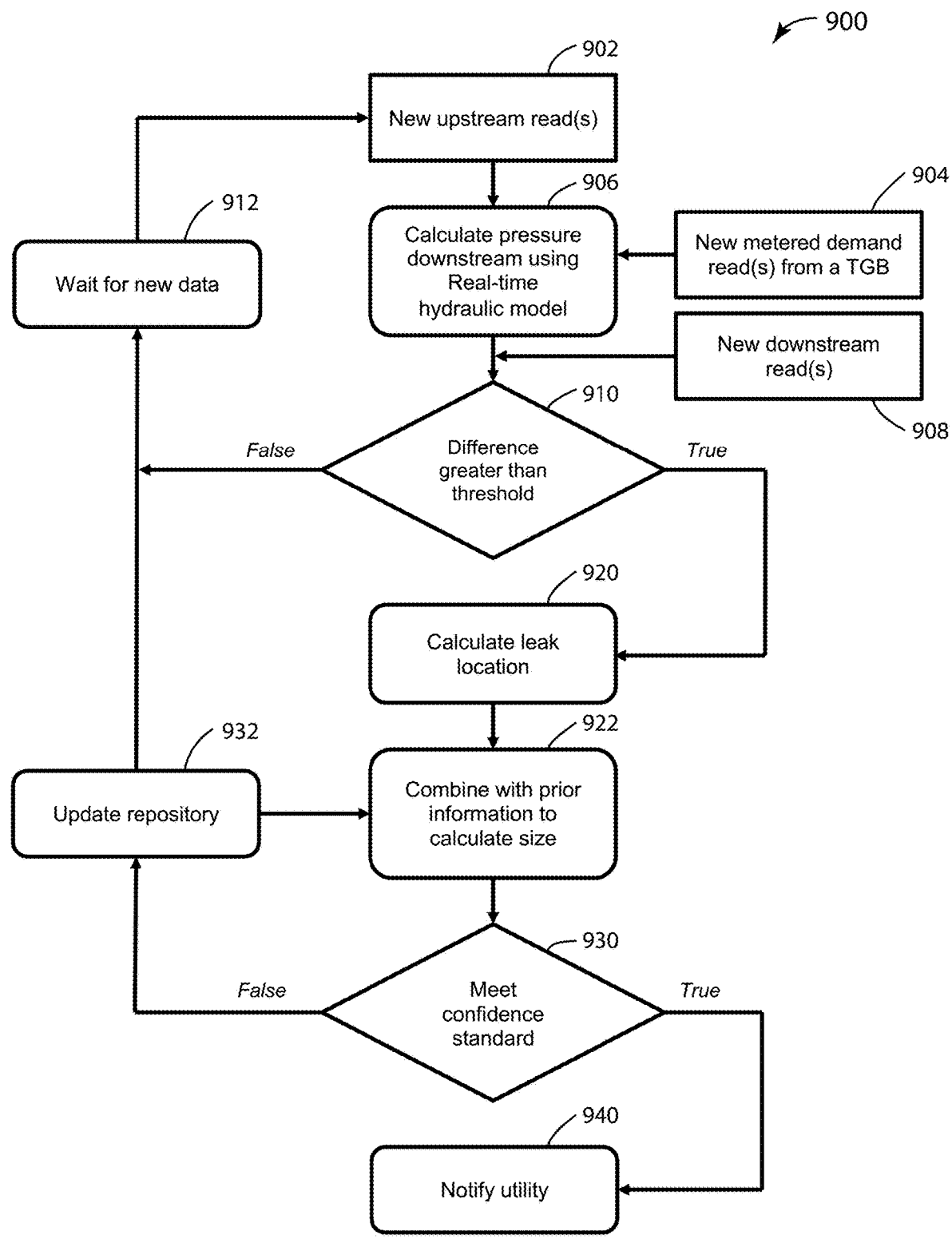
FIG. 9 is a logic flow diagram of an exemplary method for leak detection in accordance with the present disclosure.

FIG. 9 depicts a logic flow diagram of an exemplary leak detection method 900 of the present disclosure. Generally, the leak detection method 900 may be repeated and continuous. However, it is logical to describe the process starting with detecting new data. Accordingly, a first step of the exemplary process begins taking new upstream readings at step 902 from one or more upstream pressure sensors. Similarly, new metered demand readings are taken at step 904 from consumption meters 530 shown in FIGS. 8*a* and 8*b*. The new upstream readings from step 902 and new metered demand readings from step 904 are then communicated to either a Master Sensor 518 or a separate host 540 for processing.

Figure 11A:
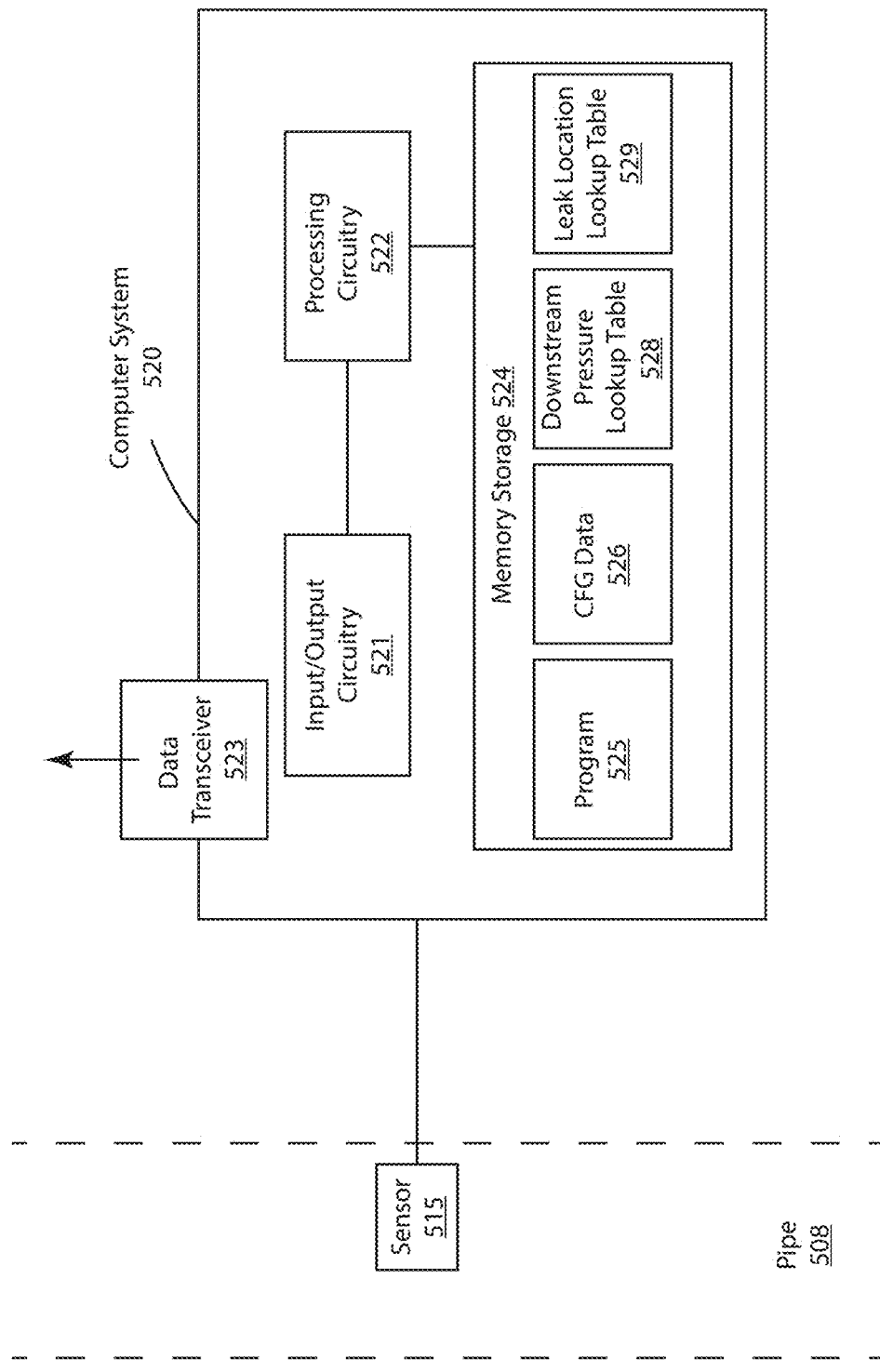
FIG. 11a is a block diagram of an exemplary computer system that communicates with a separate pressure sensor in accordance with the present disclosure.
Figure 11B:
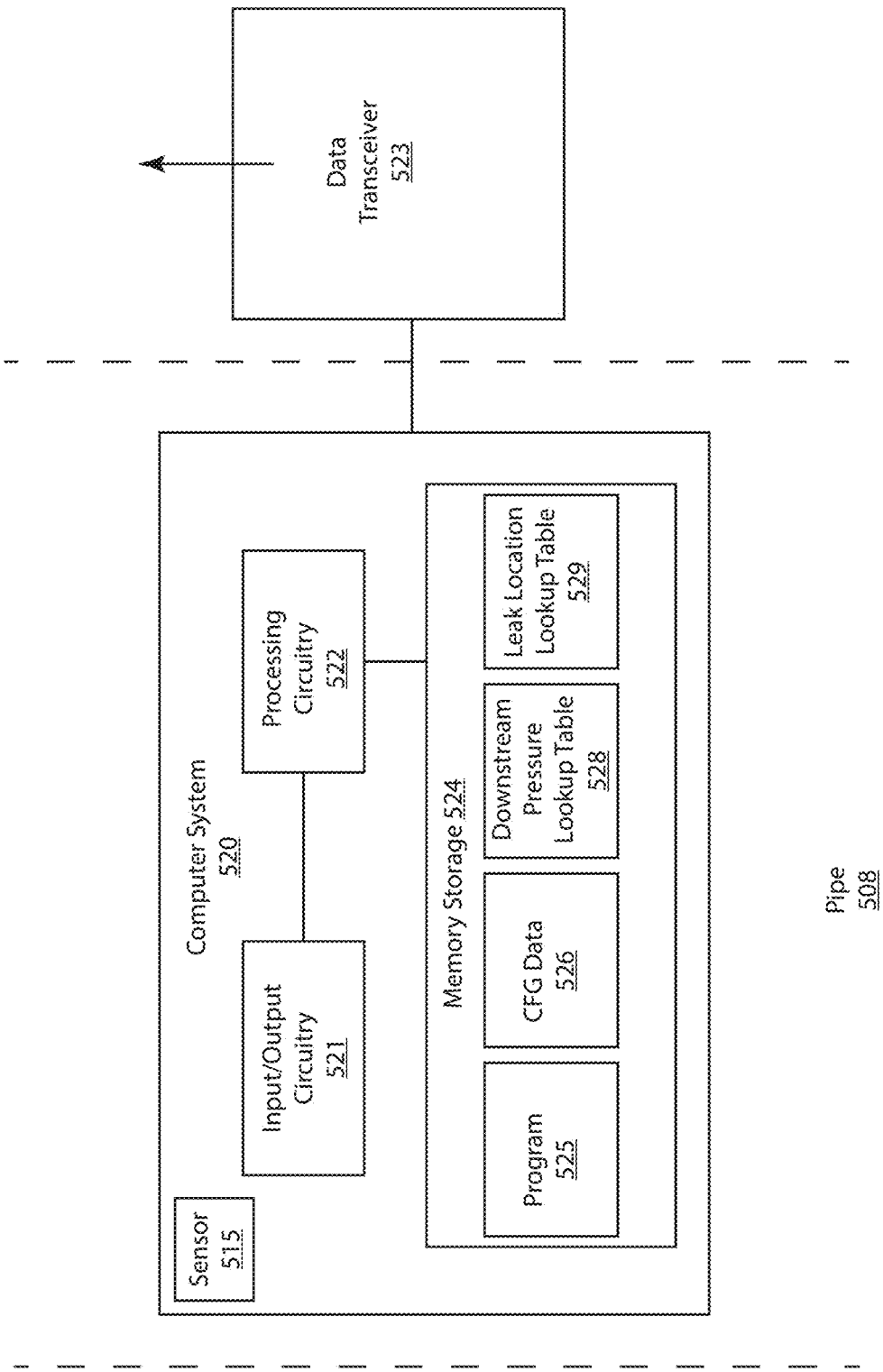
FIG. 11b is a block diagram of a computer system similar to the system of FIG. 11a, but wherein the computer system is integral to the pressure sensor.

As shown in FIGS. 11*a* and 11*b*, the communication and calculation may be performed by a computer system 520 containing input/output circuitry 521 and a data transceiver 523 to send and receive data. The computer system 520 may also comprise a memory storage 524 that further comprises a program 525 and configuration (CFG) data 526 along with a downstream pressure lookup table 528 and a leak location lookup table 529. In one embodiment, the program 525 comprises the firmware and Real-Time Hydraulic Model and the CFG data 526 comprises initialization data specifically configured for the Leak Detection System or distribution network. However, the program 525 and CFG data 526 may be combined or further subdivided. Likewise, the Real-Time Hydraulic Model and initialization or configuration data may be stored in other locations. Processing circuitry 522 communicates with the input/output circuitry 521 and the memory storage 524 to process the data in accordance with the present disclosure.

The data transmitter 523 may communicate with a Tower Gateway Base Station (TGB) to collect meter consumption data for a set of assigned meters for a given period of time and calculate the flow at the sensor location using the program 525. The program 525 calculates the pressure difference as described above.

As shown in FIG. 11*a*, the computer system 520 or other supporting elements may be physically distinct from a pressure sensor 515, including a pressure sensor 515 serving as a Master Sensor 518 or Slave Sensor 519, and may communicate by wired or wireless techniques as are known in the art. In contrast, FIG. 11*b* depicts an exemplary device wherein the computer system 520 is integral to the pressure sensor 515 such that both are contained within the pipe 508 in use. In the particular embodiment shown in FIG. 11*b*, the data transceiver remains external to the pipe 508. However, the data transceiver may also be integral to computer system 520.

Returning to FIG. 9, step 906 of the leak detection method 900 utilizes the computer system 520 to process both the new upstream readings 902 and the new metered demand readings 904 to calculate an expected pressure at a downstream location using the Real-Time Hydraulic Model, which may be stored in the memory storage 524 of computer system 520.

Next, new downstream readings are taken at step 908 and are identified from pressure sensors 515 at a downstream location of interest. The computer system 520 calculates the difference at step 910 between the calculated expected downstream pressure from the Real-Time Hydraulic Model from step 906 and the actual or detected downstream pressure readings taken at step 908 and determines whether this difference is greater than a predefined threshold. If the difference between the calculated expected pressure downstream from step 906 and the new detected downstream reading from step 908 is not greater than the threshold, the leak detection method 900 waits for new data at step 912 and repeats the process.

However, if the calculated difference is greater than the threshold, this difference indicates a leak in the distribution system. Once a leak has been indicated, the method proceeds to step 920 where a set of potential leak locations is calculated based on data from the pressure sensors 515, consumption meters 530, and previous calculations.

The leak detection method locates the set of potential leak locations through the principle of correlation. For a single discrepancy determination, the size and location of a potential leak location are interdependent and many combinations may produce the same pressure discrepancy. The set of potential leak locations may be narrowed, or confidence in location accuracy may be improved, by comparing multiple data readings and discrepancy determinations from time periods when the distribution network demands and pressures are significantly different. Specifically, by using multiple reads, infeasible combinations of size and location of leaks are identified and eliminated, increasing confidence and narrowing the set of viable leak locations. Once confidence in the location of a leak reaches a given standard, the Leak Detection System may notify the utility, trigger actions to slow or stop the leak, or activate other measures.

The calculations described above may incorporate at least two proprietary datasets as shown in FIGS. 11*a* and 11*b*: 1) a downstream pressure lookup table 528 for determining the calculated pressure at the downstream pressure sensor 515 or sensors given on upstream pressure or pressures and consumption meter readings, and 2) a leak location lookup table 529 for locating a leak based on one or more instances of discrepancies between the calculated pressure and detected downstream pressure at the downstream pressure sensor or sensors.

The downstream pressure lookup table 528 is generated by applying the Bernoulli calculation described above for each possible combination of each consumption meter 530 reading and upstream pressures at each upstream pressure sensor, such as starting point 516, and described below. Although these variables are continuous, they are physically and practically bound and may be discretized with a step smaller than the accuracy of the sensors and meters. The firmware in operation inputs the pressure sensor and consumption meter data into the downstream pressure lookup table to determine the calculated pressure for a downstream pressure sensor. As an alternative to using the table, the firmware may perform the series of Bernoulli calculations each time.

Figure 10:
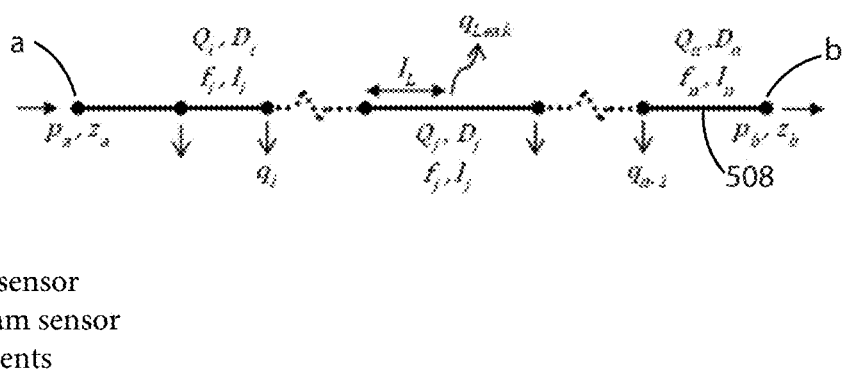
FIG. 10 is a simplified diagram of a pipe within the distribution network exemplifying the use of Bernoulli's equation in accordance with the present disclosure.

The leak location lookup table is generated by using correlation as described above for each possible combination of upstream pressure sensor readings, consumption meter readings, and possible discrepancies between the calculated pressure and detected downstream pressure for downstream sensor or sensors as described above, shown in FIG. 10, and described further below:

For a single pipeline, Equation (3) provides a calculated pressure downstream given an upstream pressure. If there is a discrepancy between the calculated pressure and the measured pressure, Equation (4) describes how to calculate the size and location of the leak.

For some number of pipe segments, n, the general equation for finding pressure downstream, given the upstream pressure, is governed by Bernoulli's Equation:

$$\frac{16Q_1^2}{2g\pi^2 D_1^4} + z_a + \frac{p_a}{\gamma} = \frac{16Q_n^2}{2g\pi^2 D_n^4} + z_b + \frac{p_b}{\gamma} + \sum_{i=1}^{n} h_{l_i}$$

where head loss, $h_l$, describes the energy lost to friction along one section of pipe. Head loss is described by the Darcy-Weisbach equation:

$$h_l = \frac{fl16Q^2}{2g\pi^2 D^5}$$

Substituting the Darcy-Weisbach equation into Bernoulli's Equation:

$$\frac{16Q_1^2}{2g\pi^2 D_1^4} + z_a + \frac{p_a}{\gamma} = \frac{16Q_n^2}{2g\pi^2 D_n^4} + z_b + \frac{p_b}{\gamma} + \sum_{i=1}^{n} \frac{f_i l_i 16 Q_i^2}{2g\pi^2 D_i^5}$$

Rearranging, the general equation for calculating the downstream pressure without a leak is:

$$\frac{p_b}{\gamma} = \frac{16Q_1^2}{2g\pi^2 D_1^4} - \frac{16Q_n^2}{2g\pi^2 D_n^4} + z_a - z_b + \frac{p_a}{\gamma} - \sum_{i=1}^{n} \frac{f_i l_i 16 Q_i^2}{2g\pi^2 D_i^5} \quad (3)$$

where $Q_i$, the flow through pipe i, is equal to the flow leaving the system plus all demands after pipe i.

$$Q_i = Q_b + \sum_{i=i}^{n} q_i$$

To determine the size and location of the leak, the downstream pressure read is set equal to an equation similar to Equation (1) but including a leak.

$$p_b' = p_b$$

where:
$p_b'$=read pressure at 'b'
$p_b$=calculated pressure at 'b'

To calculate the pressure at 'b' with a leak, Equation (3) is augmented to include the flow of the leak up to the location of the leak:

$$\frac{p_b}{\gamma} = \frac{16(Q_1 + q_L)}{2g\pi^2 D_1^4} - \frac{16Q_n^2}{2g\pi^2 D_n^4} + z_a - z_b + \frac{p_a}{\gamma} - \sum_{i=1}^{l-1} \frac{f_i l_i 16(Q_i + q_L)^2}{2g\pi^2 D_i^5} - \frac{f_j l_L 16(Q_j + q_L)^2}{2g\pi^2 D_j^5} - \frac{f_j (l_j - l_L) 16 Q_j^2}{2g\pi^2 D_j^5} - \sum_{i=1}^{n} \frac{f_i l_i 16 Q_i^2}{2g\pi^2 D_i^5}$$

where the leak occurs in pipe j, a distance $l_L$ from the pipe inlet. This equation captures the increased flow in each pipe up to the leak, which contributes to increased head loss up to the location of the leak. Substituting the downstream read into the above equation, the location of the leak is a function of the size of the leak.

$$\frac{p_b'}{\gamma} = \quad (4)$$
$$\frac{16(Q_1 + q_L)}{2g\pi^2 D_1^4} - \frac{16Q_n^2}{2g\pi^2 D_n^4} + z_a - z_b + \frac{p_a}{\gamma} - \sum_{i=1}^{l-1} \frac{f_i l_i 16(Q_i + q_L)^2}{2g\pi^2 D_i^5} - \frac{f_j l_L 16(Q_j + q_L)^2}{2g\pi^2 D_j^5} - \frac{f_j (l_j - l_L) 16 Q_j^2}{2g\pi^2 D_j^5} - \sum_{i=1}^{n} \frac{f_i l_i 16 Q_i^2}{2g\pi^2 D_i^5}$$

Since there are multiple combinations of leak size and location that result in the same downstream pressure, multiple reads are required. However, the size of the leak is not constant for a system. Furthermore, because a leak may comprise a longitudinal crack, a circumferential crack, a round hole, or other defects, a whole range of leak equations may be incorporated. Accordingly, leakage may be generally modeled as the loss of mass $q_L$, as provided below:

$$q_L = C p_j^\alpha$$

where:
C=emitter coefficient
α=emitter exponent
$p_j$=pressure at leak

During operation, each new discrepancy and corresponding pair of calculated expected pressure and detected downstream pressure reading may be inputted into the leak location lookup table 529. With each new input, the firmware narrows in on the actual or true leak location and leak size.

As stated above, the leak detection method 900 may continuously receive new upstream readings and new metered demand readings, as well as new downstream readings, also continuing to process this data to determine subsequent corresponding differences between actual pressure readings and those expected by applying the Real-Time Hydraulic Model to model in real-time, or by using a lookup table, at step 906. Accordingly, accuracy may be improved, and the list of consistent leak locations across multiple sets of potential leak locations narrowed, by combining previous sets of calculated potential leak locations from step 920 with information from previous upstream readings at step 902, previous metered demand readings at step 904, previous downstream readings at step 908, and previous calculations of differences at step 210.

Furthermore, the set of potential leak locations 920 may be combined with prior data to calculate the size of the leak at step 922 using the Real-Time Hydraulic Model. If the set of potential leak locations and corresponding sizes are determined at step 930 to meet a predetermined confidence standard, the utility may be notified of a leak at step 940. Alternatively, the method may include taking automated actions to stop or slow the leak, or actuate controls to further quantify the leak location or calculated size, for instance by controlling the flow and/or pressure within the distribution network. If instead the confidence standard of the calculated set of potential leak locations 920 or calculated leak sizes 922 is determined to be insufficient at step 930, the data may be used to update the repository at step 932 for subsequent combinations with additional data sets in step 922. The present inventors have discovered that this approach significantly decreases the amount of time and computational power necessary to pinpoint a leak over resolving Bernoulli's equation each time with new data. Additionally, the present inventors have discovered that this approach reduces the electricity required to power the device.

The present inventors have also discovered that it is advantageous to periodically update the lookup tables by recalibrating the pipe roughness values as described in U.S. patent application Ser. No. 15/226,597. In some embodiments, a hosted real-time water distribution network simulator may be used for this update.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for leak detection of a distribution network having pipes and including a plurality of consumption meters that detect a consumption data, comprising the steps of:
   dividing the distribution network into a plurality of zones, wherein each zone of the plurality of zones has an upstream location and a downstream location;
   providing a plurality of pressure sensors that detect a pressure within some of the pipes in the distribution network, wherein an upstream pressure sensor from the plurality of pressure sensors is provided at each upstream location and a downstream pressure sensor from the plurality of pressure sensors is provided at each downstream location, and wherein others of the pipes are free of the plurality of pressure sensors;
   detecting an upstream pressure from each upstream pressure sensor and a detected downstream pressure from each downstream pressure sensor;
   providing a downstream pressure lookup table that contains an expected pressure at each downstream location corresponding to no leak being present based on a range of hypothetical upstream pressures at the corresponding upstream location and the consumption data from the plurality of consumption meters;
   determining a calculated discrepancy for each downstream location, wherein the calculated discrepancy is the difference between the expected pressure and the detected downstream pressure at each downstream location;
   providing a leak location lookup table that contains a plurality of potential leak locations corresponding to a range of hypothetical discrepancies at each downstream location;
   determining a set of probable leak locations within the some of the pipes having the plurality of pressure sensors and the others of the pipes that are free of the plurality of pressure sensors corresponding to the calculated discrepancy when the calculated discrepancy exceeds a discrepancy threshold, wherein the set of probable leak locations is determined by comparing the calculated discrepancy to the range of hypothetical discrepancies in the leak location lookup table.

2. The method of claim 1, further including the step of determining an estimated leak size if the calculated discrepancy exceeds the discrepancy threshold.

3. The method of claim 1, wherein the downstream location of a first zone of the plurality of zones is also the upstream location of a second zone of the plurality of zones that is downstream of the first zone.

4. The method of claim 1, wherein the downstream pressure lookup table and the leak location table comprise a plurality of models, and wherein the plurality of models are updated based on detected pressure and consumption data over time.

5. The method of claim 1, wherein a processor performs the determinations of calculated discrepancy and probable leak location.

6. The method of claim 1, further comprising the step of providing a host, wherein at least one pressure sensor of the plurality of pressure sensors transmits pressure data to the host to perform the determinations of calculated discrepancy and probable leak location.

7. The method of claim 6, wherein a first pressure sensor of the plurality of pressure sensors is a master sensor, wherein a second pressure sensor of the plurality of pressure sensors is a slave sensor, wherein the host is integral to the master sensor, and wherein the slave sensor wirelessly communicates with the master sensor.

8. The method of claim 1, wherein the steps of method 1 are repeated after an elapsed time and the sets of probable leak locations are compared to identify a consistent probable leak location among the sets of probable leak locations over time, wherein the consistent probably leak location is consistent across multiple sets of probable leak locations.

9. A system for leak detection within a distribution network that has pipes and includes a plurality of consumption meters that detect a consumption data, comprising:
   a plurality of zones within the distribution network, each zone within the plurality of zones having at least an upstream location and a downstream location;
   a plurality of pressure sensors configured to detect a pressure within some of the pipes in the distribution network, wherein an upstream pressure sensor detects an upstream pressure at the upstream location and a downstream pressure sensor detects a detected downstream pressure at the downstream location within each zone, and wherein others of the pipes are free of the plurality of pressure sensors;
   a downstream pressure lookup table that contains an expected downstream pressure at each downstream location corresponding to no leak being present based on a range of hypothetical upstream pressures at the corresponding upstream location and the consumption data from the plurality of consumption meters;

a leak location lookup table that contains a plurality of potential leak locations corresponding to a range of hypothetical discrepancies at each downstream location;

a non-transitory memory that stores the downstream pressure lookup table and the leak location lookup table; and a processor in communication with the plurality of pressure sensors, the plurality of consumption meters, and the non-transitory memory, wherein the processor determines a calculated discrepancy at each downstream location by calculating the difference between the expected downstream pressure and the detected downstream pressure at the downstream location, wherein if the processor further determines that the calculated discrepancy exceeds a discrepancy threshold, the processor determines a set of probable leak locations within the some of the pipes having the plurality of pressure sensors and the others of the pipes that are free of the plurality of pressure sensors by comparing the calculated discrepancy to the range of hypothetical discrepancies in the leak location lookup table.

10. The system of claim 9, wherein if the processor determines that the calculated discrepancy exceeds the discrepancy threshold, the processor determines an estimated leak size.

11. The system of claim 8, wherein the downstream location of a first zone of the plurality of zones is also the upstream location of a second zone of the plurality of zones that is downstream of the first zone.

12. The system of claim 9, wherein the downstream pressure lookup table and the leak location lookup table comprise a plurality of models, and wherein the plurality of models are updated based on detected pressure and consumption data over time.

13. The system of claim 9, further comprising a host comprising at least one of the non-transitory memory and the processor, wherein at least one pressure sensor is physically separated from the host and transmits detected pressure data to the host.

14. The system of claim 9, wherein the plurality of pressure sensors detect an additional detected pressure, wherein the plurality of consumption meters continue to detect consumption data, wherein the processor continues to determine calculated discrepancies, wherein the processor continues to determine the set of probable leak locations corresponding to any calculated discrepancies that exceed the discrepancy threshold, and wherein the processor compares corresponding sets of probable leak locations to determine a consistent probable leak location among the sets of probable leak locations over time, wherein the consistent probably leak location is consistent across multiple sets of probable leak locations.

15. An edge analysis leak device for detecting leaks in a distribution network that has pipes and includes a plurality of consumption meters providing a consumption data, comprising:

an upstream pressure sensor configured to detect an upstream pressure at an upstream location within the distribution network;

a downstream pressure sensor configured to detect a downstream pressure at a downstream location within the distribution network, wherein the upstream pressure sensor and the downstream pressure sensor detect the upstream pressure and the downstream pressure, respectively, in some of the pipes, and wherein others of the pipes are free of the plurality of pressure sensors;

a non-transitory memory that stores a downstream pressure lookup table and a leak location lookup table, wherein the downstream pressure lookup table contains an expected downstream pressure at each downstream location corresponding to no leak being present based on a range of hypothetical upstream pressure at each corresponding upstream location and the consumption data from the plurality of consumption meters, wherein the leak location lookup table contains a plurality of potential leak locations corresponding to a range of hypothetical discrepancies at each downstream location;

a processor in communication with the upstream pressure sensor, the downstream pressure sensor, the plurality of consumption meters, and the non-transitory memory, wherein the processor determines a calculated discrepancy at each downstream location by calculating the difference between the expected downstream pressure and the detected downstream pressure at each downstream location, and wherein if the processor determines that any calculated discrepancy exceeds a discrepancy threshold, the processor determines a set of probable leak locations within the some of the pipes having the plurality of pressure sensors and the others of the pipes that are free of the plurality of pressure sensors corresponding to the calculated discrepancy by comparing the calculated discrepancy to the range of hypothetical discrepancies in the leak location lookup table.

16. The edge analysis leak device of claim 15, wherein when the processor determines that the calculated discrepancy exceeds the discrepancy threshold, the processor is further configured to determine an estimated leak size.

17. The edge analysis leak device of claim 15, wherein the distribution network is divided into a plurality of zones, and wherein the downstream location of a first zone within a plurality of zones is the upstream location of a second zone within the plurality of zones that is downstream of the first zone.

18. The edge analysis leak device of claim 15, wherein the downstream pressure lookup table and the leak location lookup table comprise a plurality of models, and wherein the plurality of models are updated based on the detected pressure and the consumption data over time.

19. The edge analysis leak device of claim 15, further comprising a host that comprises at least one of either the non-transitory memory or the processor, and wherein at least one either the upstream pressure sensor or the downstream pressure sensor is physically separated from the host and transmits the detected pressure to the host.

20. The edge analysis leak device of claim 15, wherein at least one of either the upstream pressure sensor or the downstream pressure sensor detects an additional detected pressure, wherein the plurality of consumption meters continue to detect consumption data, wherein the processor continues to determine calculated discrepancies, wherein the processor continues to determine the set of probable leak locations corresponding to any calculated discrepancies that exceed the discrepancy threshold, and wherein the processor compares corresponding sets of probable leak locations to determine a consistent probable leak location among the sets of probable leak locations over time, wherein the consistent probably leak location is consistent across multiple sets of probable leak locations.

* * * * *